United States Patent [19]
Spaeth et al.

[11] Patent Number: 5,808,323
[45] Date of Patent: Sep. 15, 1998

[54] MICROOPTICAL DEVICE WITH MIRRORS

[75] Inventors: Werner Spaeth, Holzkirchen; Stefan Groetsch, Regensburg; Ralf Moser, Abensberg; Georg Bogner, Regensburg, all of Germany

[73] Assignee: Siemens Aktiengesellschaft, Munich, Germany

[21] Appl. No.: 625,636

[22] Filed: Mar. 29, 1996

[30] Foreign Application Priority Data

Mar. 29, 1995 [DE] Germany .................. 195 11 593 7

[51] Int. Cl.$^6$ ....................................... H01L 33/00
[52] U.S. Cl. ................... 257/88; 257/98; 257/99; 359/625; 359/627; 372/50; 372/99; 372/101; 372/107
[58] Field of Search ................. 257/98, 99, 88; 359/625, 627, 623, 719, 834, 618; 372/107, 50, 99, 101

[56] References Cited

U.S. PATENT DOCUMENTS

| | | | |
|---|---|---|---|
| 4,823,357 | 4/1989 | Casey | 372/92 |
| 5,168,401 | 12/1992 | Endriz | 359/625 |
| 5,333,077 | 7/1994 | Legar et al. | 359/619 |
| 5,369,659 | 11/1994 | Furumoto et al. | 372/50 |

FOREIGN PATENT DOCUMENTS

4438368A1  5/1996  Germany .

OTHER PUBLICATIONS

World News, 2394 Laser Focus World, May 30, 1994, No. 5, Tulsa, OK, US.
Publication: "Laser Focus World", May 1994, p. 47, Offset–plane mirrors transform laser beams, by J. R. Hobbs.

*Primary Examiner*—William Mintel
*Attorney, Agent, or Firm*—Herbert L. Lerner; Laurence A. Greenberg

[57] ABSTRACT

The microoptical device has beam-parallelizing optics and a deflecting mirror configuration. The device converts a laser beam bundle, which is emitted by a laser diode strip structure or individual diode chips and which is comprised of a plurality of strip-shaped individual laser beams, into a rectangular or parallelogram-shaped laser beam bundle composed of parallelized strip-shaped individual laser beams arranged parallel next to one another. The beam-parallelizing optics may be a cylindrical lens, and the deflecting mirror configuration may be two rows of mirrors. The cylindrical lens and the rows of mirrors are preferably produced from a semiconductor material and they can therefore be produced cost effectively by means of methods used in semiconductor process engineering.

15 Claims, 4 Drawing Sheets

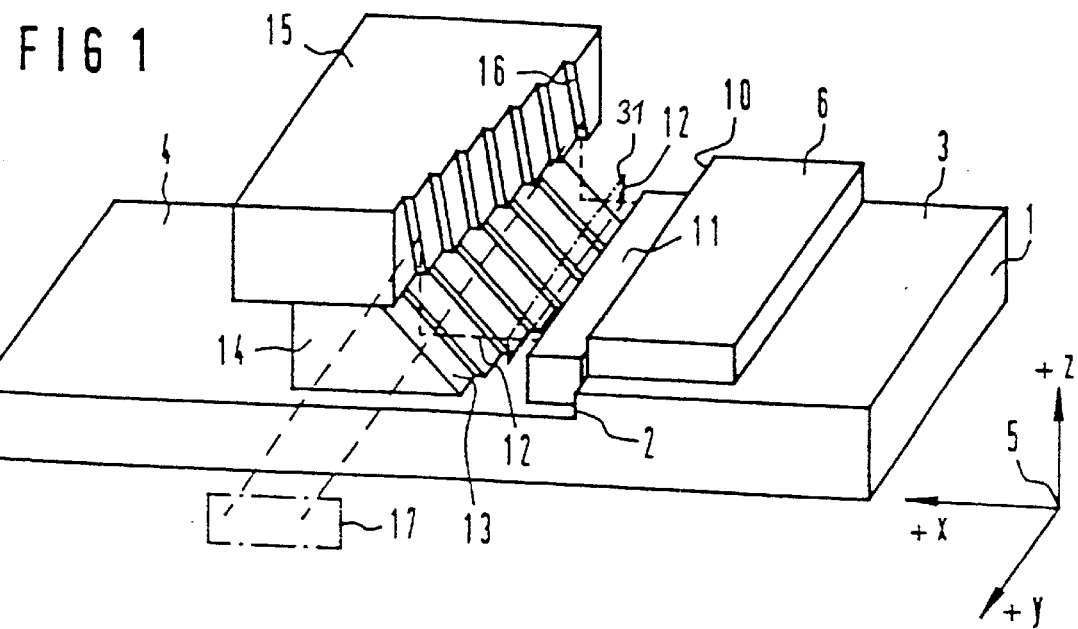
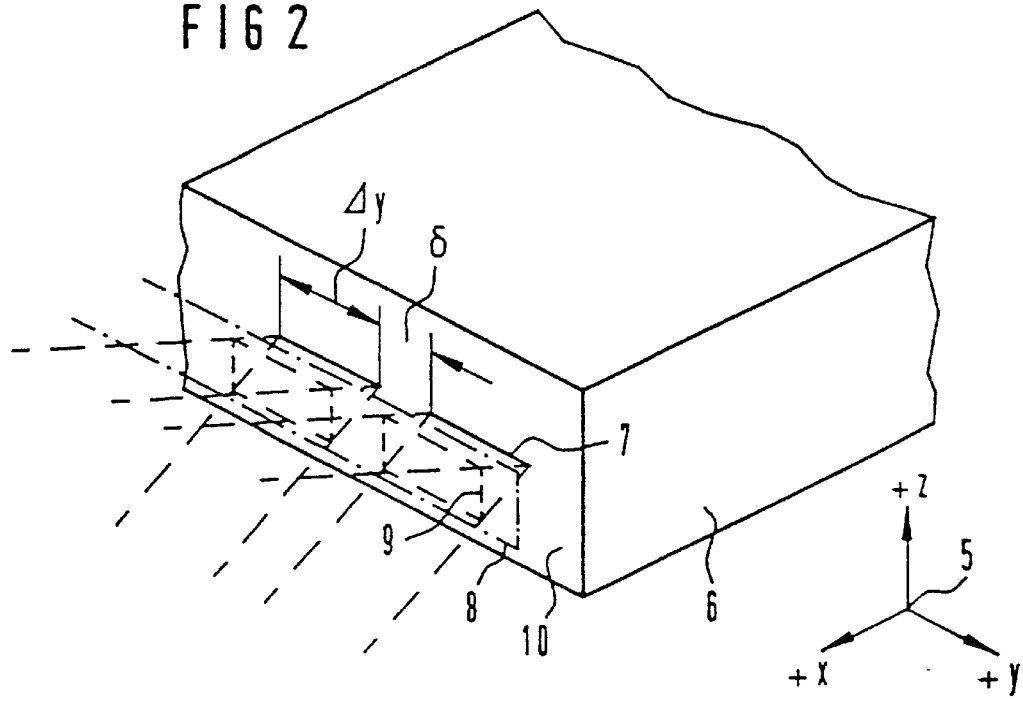

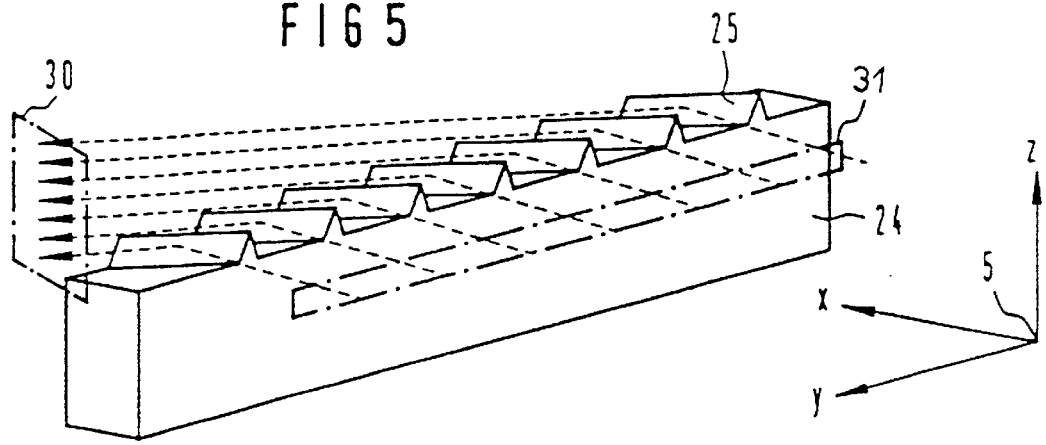
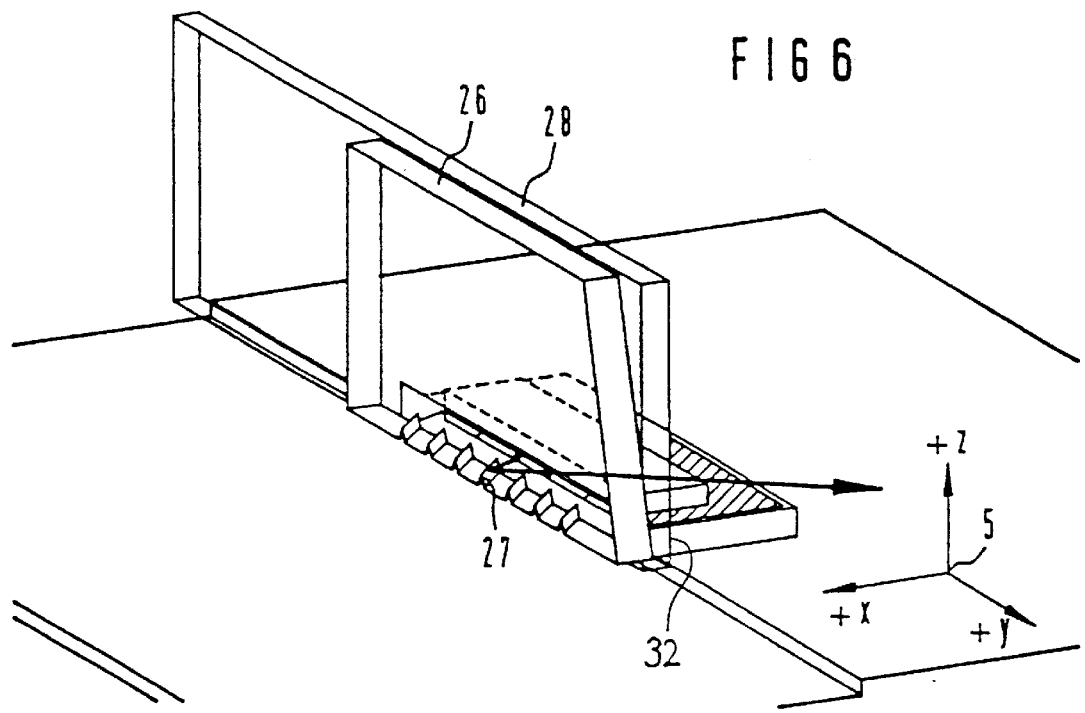

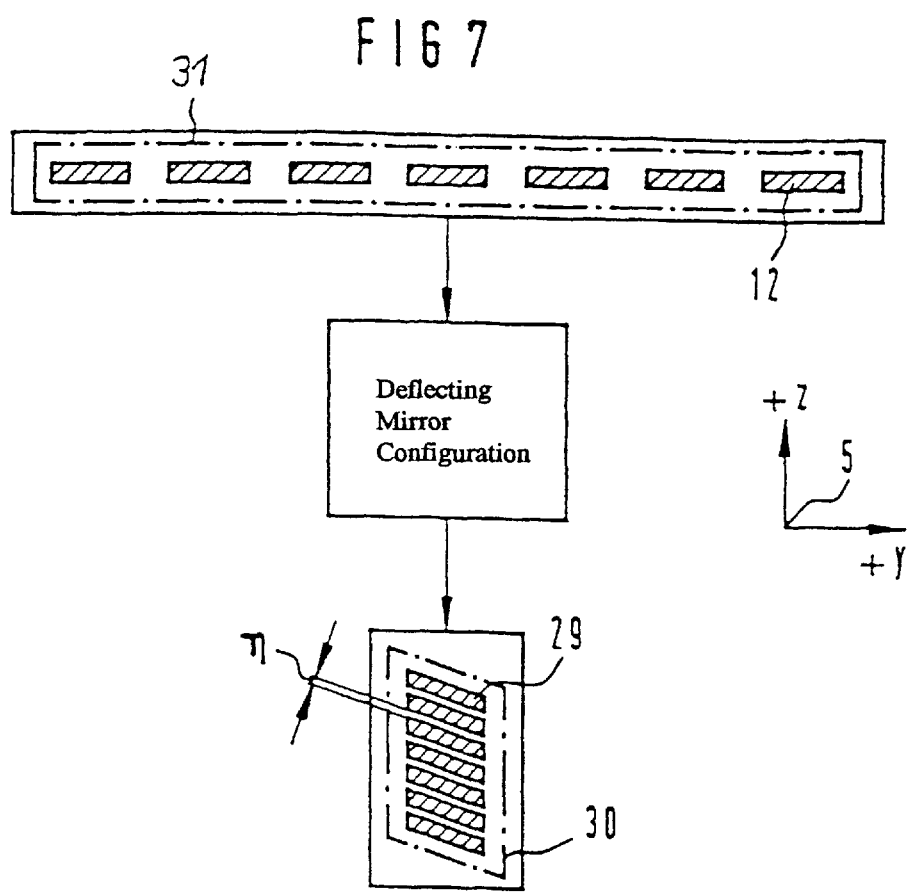

MICROOPTICAL DEVICE WITH MIRRORS

BACKGROUND OF THE INVENTION

1. Field of the Invention:

The invention relates to a microoptical device for converting a first laser beam bundle into a second laser beam bundle; the first laser beam which is emitted by one or more laser diode bars or a plurality of individual laser diode chips in the x-direction of an orthogonal reference system and it comprises a plurality of individual laser beams with a strip-shaped cross-section.

2. Description of the Related Art:

Such a microoptical device is disclosed, for example, in J. R. Hobbs, "Diode pumped solid-state lasers: Offset-plane mirrors transform laser beams", Laser Focus World, May 1994, page 47. The microoptical device described therein comprises two reflecting mirrors disposed parallel to one another and at a set distance from one another. The two mirrors are mutually offset vertically and horizontally. The first laser beam bundle, incident at an angle $\alpha$, where $0°<\alpha<190°$, relative to the mirror surface normal, of a laser diode array is transformed by means of suitable multiple total reflection between the two mirrors into the second laser beam bundle composed of strip-shaped individual laser beams arranged parallel next to one another. A substantial difficulty of this mirror system consists in that effective conversion of beam bundles requires highly accurate adjustment of the two mirrors relative to one another and of the pair of mirrors relative to the incident first laser beam bundle. Furthermore, the reflections losses due to multiple reflection inside the mirror pair are very high. The maximum conversion efficiency achieved is approximately 70%.

SUMMARY OF THE INVENTION

It is accordingly an object of the invention to provide a microoptical device, which overcomes the above-mentioned disadvantages of the heretofore-known device and method of this general type, which is easy to adjust, and the conversion efficiency of which lies between 90% and 100%. Furthermore, it should be possible for such a microoptical device to be produced cost effectively.

With the foregoing and other objects in view there is provided, in accordance with the invention, a microoptical device for reshaping a first laser beam bundle emitted by a laser light source (e.g. a laser diode array, a laser light bar, individual diode chips) into a second laser beam bundle, the first laser beam bundle extending in an x-direction of an orthogonal reference system and being composed of a plurality of individual laser beams having a strip-shaped cross-section and diverging in a z-direction of the orthogonal reference system. The microoptical device comprising:

beam-parallelizing optics receiving the first laser beam bundle and parallelizing the individual laser beams to mutually parallel strip-shaped laser beams; and a deflecting mirror configuration receiving the mutually parallel strip-shaped laser beams and converting the mutually parallel strip-shaped laser beams into a second laser beam bundle.

In accordance with an added feature of the invention, the strip-shaped cross-sections of the individual laser beams of the first laser beam bundle each extend along longitudinal central axes lying on a single straight line extending in the y-direction of the orthogonal reference system.

In accordance with an additional feature of the invention, the second laser beam bundle includes a plurality of mutually parallel individual laser beams each having a strip-shaped, preferably identical, cross-section.

In accordance with another feature of the invention, the beam-parallelizing optics include a cylindrical lens and/or a diffractive optical system.

In accordance with again an added feature of the invention, the deflecting mirror configuration includes a first and a second row of mirrors, the first row of mirrors deflecting the parallelized individual laser beams out of the x-direction and simultaneously offsetting the parallelized individual laser beams relative to one another in the x-direction, such that longitudinal central axes defined within the cross-sections of the parallelized individual laser beams lie on straight lines extending parallel to one another at a given spacing from one another, and the second row of mirrors imaging the mutually offset parallelized individual laser beams parallel and next to one another.

In accordance with again another feature of the invention, the deflecting mirror configuration comprises a single row of mirrors deflecting the parallelized individual laser beams out of the x-direction, offsetting the parallelized individual laser beams relative to one another in the z-direction, and imaging the parallelized individual laser beams parallel and next to one another.

In accordance with a concomitant feature of the invention, the beam-parallelizing optics and the deflecting mirror configuration consist of a semiconductor material which is transparent relative to a wavelength of the laser light emitted by the laser light source, and the laser beams being guided in the interior of the semiconductor material.

With the above and other objects in view there is also provided, in accordance with the invention, a method of producing a microoptical device as outlined above. The method comprises etching the beam-parallelizing optics and the deflecting mirror configuration in semiconductor etching technology.

In other words, the objects of the invention are satisfied when a beam-parallelizing optical system parallelizes the individual laser beams of the first laser-beam bundle, which diverge in the z-direction of the reference system, and in that subsequently a deflecting mirror configuration converts the laser beam bundle composed of the parallelized strip-shaped individual laser beams into the second laser beam bundle.

The microoptical device of the invention may consist, for example, of a semiconductor material which is transparent to the particular wavelength of the laser light emitted by the laser diode array. The laser beam bundle can then be guided in the semiconductor material, as a result of which the beam expansion (beam bleeding) of the individual laser beams and thus also the radiation loss can be reduced. The structures of the beam-parallelizing optical system and of the deflecting mirror configuration can be produced by means of etching techniques known in semiconductor process engineering. This ensures cost effective production of the microoptical device.

Other features which are considered as characteristic for the invention are set forth in the appended claims.

Although the invention is illustrated and described herein as embodied in a microoptical device, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

BRIEF DESCRIPTION OF THE DRAWING

FIG. 1 is a diagrammatic perspective view of a first exemplary embodiment of a microoptical device according to the invention;

FIG. 2 is a diagrammatic perspective view of a segment of a laser diode bar;

FIG. 5 is a diagrammatic perspective view of a deflecting mirror configuration of a third exemplary embodiment;

FIG. 6 is a perspective view of a fourth exemplary embodiment; and

FIG. 7 is a view similar to FIG. 4 of a beam bundle conversion with the third and fourth embodiments.

DESCRIPTION OF THE PREFERRED EMBODIMENTS

Figure 3:
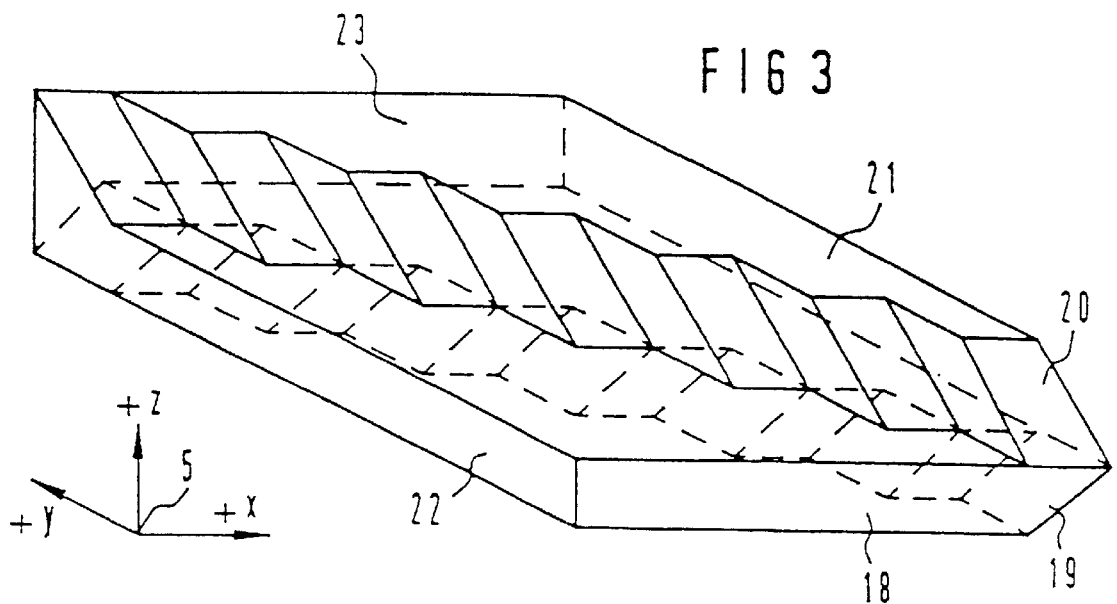
FIG. 3 is a perspective view of a deflecting mirror configuration of a second embodiment of the invention.

Referring now to the figures of the drawing in detail, the exemplary embodiments described herein serve the purpose of converting a laser beam bundle 8 which is emitted by a laser diode bar 6 as shown in FIG. 2. The laser diode bar 6 is a diode array which comprises seven individual laser diodes 7. The pn junctions of the individual laser diodes 7 are arranged parallel to the x-y plane of an orthogonal reference system 5 (cartesian coordinate system). Each individual laser diode 7 emits one individual laser beam 9 of width $\Delta y$. The beams have only a very weak divergence parallel to the pn junction of the individual laser diode and a strong divergence perpendicular to the pn junction. However, for the sake of simplicity it will be assumed below that the individual laser diodes 7 emit individual laser beams 9 which are divergent only in a direction perpendicular to the pn junctions of the individual laser diodes 7 and they are (idealized and) parallel to the pn junctions.

Instead of the laser diode bar 6, it is, of course, also possible in all the exemplary embodiments to use a plurality of laser diode bars or a number of individual laser diode chips.

Referring now more specifically to FIG. 1, the first exemplary embodiment of a microoptical device according to the invention is constructed on a baseplate 1. The baseplate 1 consists, for example, of a Mo/Cu alloy. Any other material is suitable as well which is a good conductor of heat and which has a coefficient of thermal expansion that is matched to the coefficients of thermal expansion of the other components of the microoptical device. The top surface of the baseplate 1 is divided by a vertical step 2 into two regions 3 and 4. The two regions 3 and 4 are parallel to the x-y plane of the orthogonal reference system 5. The laser diode bar 6 is fastened to the higher area 3, for example by means of solder or glue, in such a way that the laser light exit face 10 of the laser diode bar 6 terminates in alignment with the perpendicular face of the step 2. The individual laser beams 9 are thus emitted in the x-direction.

A plano-convex cylindrical lens 11 is fastened to the lower region 4 and adjoins the laser light exit face 10 with its curved surface. However, the lens 11 can also be disposed at a slight spacing from the light exit face 10 in such a way that the curved surface and the light exit surface 10 are opposite one another. The cylindrical lens 11 is produced, for example, from glass, plastic or from a semiconductor material which is transparent to the particular wavelength of the laser light of the individual laser diodes. Semiconductor materials are particularly suitable for this application because of their superior refractive index. For example, SiC can be used for optical wavelengths $\lambda > 400$ nm, GaP for $\lambda > 500$ nm, GaAs for $\lambda > 900$ nm, and Si for $\lambda > 1100$ nm. The cylindrical lens 11 parallelizes (aligns) the individual laser beams 9, which diverge strongly in the z-direction of the reference system 5. Thus, a laser beam bundle 31 comprising seven parallelized individual laser beams 12 having the same strip-shaped cross-section exits from the cylindrical lens 11. The longitudinal central axes of the cross-sections of the individual laser beams 12 lie on a single straight line parallel to the y-axis of the reference system 5. In FIG. 1, the parallelized individual laser beams 12 arranged at the edge are represented by their beam axes.

Instead of the cylindrical lens 11, it is also possible to use a diffractive optical system or a combination of a cylindrical lens and a diffractive optical system.

A row 14 of mirrors (mirror array 14) formed of seven individual mirrors 13 is fastened to the region 4 in the beam propagation direction (x-direction) downstream of the cyclindrical lens 11. The row is produced, for example, from metal or from a semiconductor material, and the mirror surfaces are coated and/or polished; coated with a reflection enhancing material such as, for example, aluminum or SiO$_2$/Si by means of vapor deposition or sputtering. The mirror surface normals of the individual mirrors 13 form an angle of 45° with the beam axes of the parallelized individual laser beams 12 and they extend parallel to the x-z plane of the reference system 5. With respect to its neighboring individual mirrors 13, each individual mirror 13 is displaced parallel to the x-direction by $\Delta Z + \epsilon$, with the result that the row 14 of mirrors has a step-shaped structure. The beam height in the z-direction is $\Delta z$ and, given precisely orthogonal projection of the individual laser beams 12, $\epsilon$ is the spacing (see FIG. 4) between the strip-shaped individual laser beams 12 after the conversion of the laser beam bundle 31 into the laser beam bundle 17.

The width and length of the mirror surfaces of the individual mirrors 13 is $\Delta y + \delta$, or at least $\Delta z / \cos 45°$ ($\Delta z / \cos \frac{1}{4}\pi$). The width of an individual laser beam 9 after exiting from the laser diode is $\Delta y$, and $\delta$ is the spacing between two individual laser beams 9. The parallelized individual laser beams 12 are deflected by 90° in the z-direction by the row 14 of mirrors and simultaneously offset with respect to one another in the x-direction in such a way that no two individual laser beams 12 lie with the longitudinal central axis of their cross-section on a common straight line. A further row 15 of mirrors with seven individual mirrors 16 is disposed above the row 14 of mirrors. The row 15 of mirrors is, for example, identically produced with the row 14 of mirrors. The mirror surface normals of the individual mirrors 16 form an angle of 45° with the beam axes of the individual laser beams 12, which are deflected by 90° in the z-direction, and extend parallel to the y-z plane of the reference system 5. With respect to its neighboring individual mirrors 16, each individual mirror 16 is displaced parallel to the y-direction by $\Delta y + \delta$ with the result that the row 15 of mirrors has a step-shaped structure. The width and length of the mirror surfaces of the individual mirrors 16 is $\Delta z + \epsilon$ or $(\Delta y + \delta)/\cos 45°$. The individual mirrors 13, 16 are arranged relative to one another such that the center points of the mirror surfaces are situated exactly above one another in the z-direction. The row 15 of mirrors deflects the individual laser beams 12, deflected in the z-direction by the row 14 of mirrors, by 90° in the y-direction, and images the individual laser beams 12 parallel next to one another as shown in FIG. 4.

The deflecting mirror array, represented diagrammatically in FIG. 3 (a second exemplary embodiment of the microoptical device according to the invention), likewise comprises two rows 18, 21 of mirrors respectively composed of seven individual mirrors 19, 20. The arrangement and size of the individual mirrors 19, 20 as well as the arrangement of the remaining components of the microoptical device are identical to the first exemplary embodiment. The difference with regard to the mirror arrays 14 and 15 lies in the fact that the individual laser beams 12 downstream of the cylindrical lens 11 are guided not in air but in a medium which is transparent to the wavelength of the laser light emitted by the individual laser diodes. In this exemplary embodiment, the boundary surfaces between the optically transparent medium and air or another bounding medium form the mirror surfaces of the individual mirrors 19, 20. The individual mirrors 19, 20 are formed, for example, from cutouts from a single cuboid consisting of the transparent medium. Apart from glass and plastic, it is also possible, for example, to use SiC for an optical wavelength $\lambda > 400$ nm, GaP for $\lambda > 550$ nm, GaAs for $\lambda > 900$ nm, and Si for $\lambda > 1100$ nm. The advantage of these semiconductor materials consists in that because of their high refractive index there is no need to coat the mirror surfaces of the individual mirrors 19, 20. When glass is used, the mirror surfaces can be coated with aluminum or with another suitable material, for example, in order to improve the reflective properties. Vapor deposition, sputtering, or another method known from semiconductor process engineering and from surface optics can be applied as the coating method.

In the case of the second exemplary embodiment, the parallel individual beams 12 enter the row 18 of mirrors through a light entry surface 22 and they are deflected at the individual mirrors 19 by 90° in the z-direction. They are simultaneously offset with respect to one another in the x-direction. The individual laser beams 12 are subsequently deflected by 90° in the y-direction by the individual mirrors 20, and they exit from the mirror array 21 through a light exit surface 23.

Figure 4:
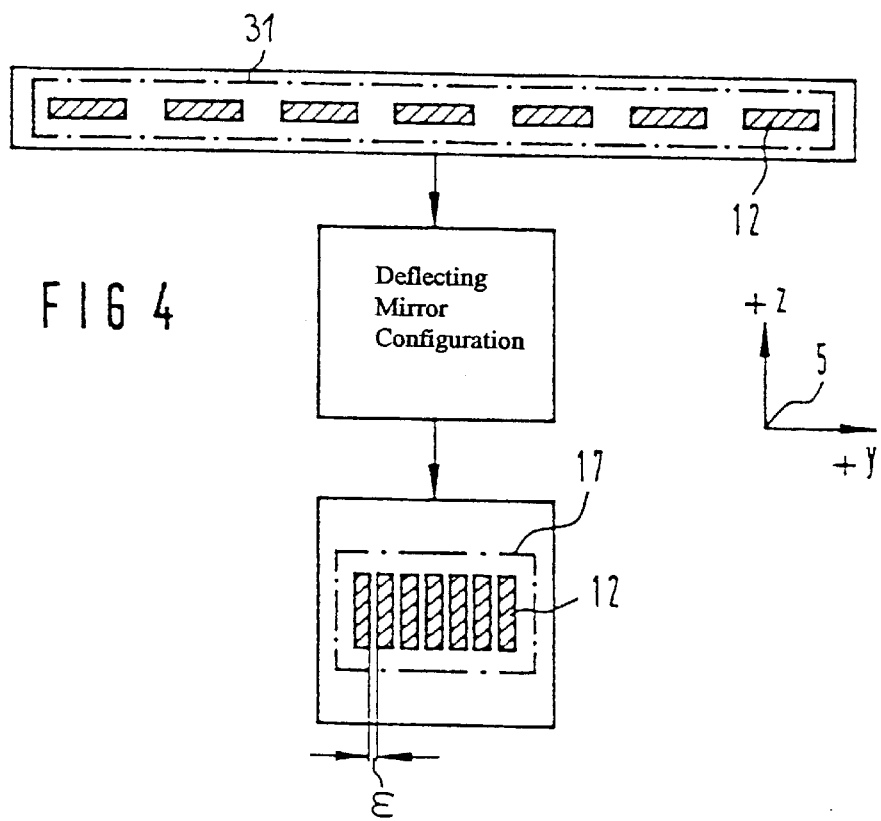
FIG. 4 is a diagrammatic view of a beam bundle conversion by means of a microoptical device in accordance with the first or second exemplary embodiments.

FIG. 4 diagrams the conversion of the laser beam bundle 31 by means of the deflecting mirror configuration in accordance with the first and second exemplary embodiments. The laser beam bundle 31 composed of seven parallelized individual laser beams 12 is converted into a rectangular laser beam bundle 17 composed of seven parallelized individual laser beams 12 arranged parallel next to one another at a spacing $\epsilon$.

A simplification of the first and second embodiments described above can be achieved by replacing the row 14 or the row 18 of mirrors by a single relatively large mirror. This mirror must be fitted such that its mirror surface normal encloses an angle of 45° with the x-y plane of the reference system 5, and an angle $\gamma > 0°$ with the x-z plane. The width of the oblique mirror is (length of the laser diode bar 6)* cos $\gamma$ and the height of the oblique mirror is at least $\Delta z / \cos 45°$. The structure of the mirror arrays 15 or 21 remains unchanged. The width of the individual mirrors 16 or 20, however, is defined by $(\Delta y + \delta)^* \tan \gamma$.

Referring now more specifically to FIG. 5, the third exemplary embodiment of the microoptical device according to the invention has a single row 24 of mirrors instead of two rows of mirrors each deflecting by 90°. The row 24 of mirrors represented in FIG. 5 comprises seven individual mirrors 25 whose mirror surface normals are at an angle of 45° to the x-z plane of the reference system 5 and an angle of $\alpha > 0°$ to the x-y plane. The center points of the mirror surfaces of the individual mirrors 25 lie on a single straight line extending parallel to the y-axis of the reference system 5, and at a spacing of $\Delta y + \delta$ from one another. The length of the individual mirrors 25 is at least $\Delta y / \cos 45°$, and the width is at least $\Delta z / \cos \alpha$. The angle $\alpha$ is selected such that, after reflection at the corresponding individual mirror 25, each parallelized individual laser beam 12 is guided away via a single mirror 30 disposed downstream in the +y-direction. In order to set the spacing $\eta$ (FIG. 7) between the imaged individual laser beams 29 as small as possible, the width of the individual mirrors 25 and the angle $\alpha$ are to be selected to be as small as possible. The minimum size of the angle $\alpha$ depends on the spacing between the individual laser diodes and the width of the individual mirrors 25.

The fourth examplary embodiment represented in FIG. 6 is identical in principle to the third exemplary embodiment. The difference is found in the fact that the row 26 of mirrors with the individual mirrors 27 is constructed such that the individual laser beams 12 are guided not in air but in a light-conducting medium. The medium is transparent to the wavelength of the laser light emitted by the individual laser diodes. The row 26 of mirrors can be produced, for example, from the materials already mentioned in the context of the second exemplary embodiment. The individual mirrors 27 are formed, for example, from wedge-shaped cutouts from a cuboid consisting of the medium which is transparent to the particular laser light. For the purpose of improving their reflective properties, the mirror surfaces are coated and/or polished, for example, coated with aluminum or $SiO_2/Si$ (possibly alternating layers, that is to say $SiO_2$ and Si in alternation). The row 26 of mirrors is coupled to the cylindrical lens 11 by means of a coupling plate 28 which likewise consists of material which is transparent to the wavelength of the laser light. The row 26 of mirrors and the coupling plate 28 can, however, also comprise a single part. Instead of the coupling plate 28 it is also possible to arrange between the row 26 of mirrors and the laser diode bar a plate in which the cylindrical lens 11 and/or further lenses are inserted or constructed. This plate can consist of a semiconductor material. The lens(es) can be produced by means of conventional semiconductor processes.

FIG. 7 diagrams the conversion of the laser beam bundle 31 with the deflecting mirror configuration of the third and fourth embodiments. The laser beam bundle 31, composed of seven parallelized strip-shaped individual laser beams 12, is converted into a parallelogram-shaped laser beam bundle 30 composed of seven parallelized strip-shaped individual laser beams 29 arranged parallel next to one another at a spacing of $\eta$.

It may be pointed out again at this juncture that the individual laser beams 9 parallel to the pn-junction of the individual laser diodes 7 are not, as presumed in the foregoing specific description, exactly parallel, but they are weakly divergent. The mirror dimensions must therefore be appropriately matched. The minimum dimensions specified above are changed towards larger values. The same applies if the individual laser beams 12 are not exactly parallelized but are weakly divergent. The calculation is then always determined by the values of $\Delta y$ and $\Delta z$ at the mirror surfaces of those mirrors which are farthest removed in the beam direction from the light exit surface 10.

Guiding the individual laser beams 9, 12, 29 in an optical medium has the advantage that their expansion can be prevented. In an advantageous way, it is possible in the case of the second and fourth exemplary embodiments for the light exit surface 10 of the cylindrical lens 11 to adjoin directly at the light entry surface 22 or 32 of the mirror array 18 and the coupling plate 28. The number of optical interfaces (boundary conditions), which cause reflection losses, can thereby be minimized in the microoptical device. It should also be understood that the rows or row of mirrors and the cylindrical lens can be produced from one part.

The mirror configurations described above and the cylindrical lens distinguish themselves in that they can be produced inexpensively and with cost effective methods.

Plano-convex cylindrical lenses composed of semiconductor materials can be produced, for example, on a wafer with otherwise conventional etching processes. The wafer is then cut into individual lenses of suitable length and width.

The mirror arrays can be produced, for example, from Si, GaP, GaAs, SiC, metal or glass by means of etching methods known in semiconductor process engineering. However, it is also equally possible to use injection-molding, molding and casting methods for plastic, glass or metal. The so-called LIGA method, for example, can be used to produce the molds. The mirror structures can also be produced by means of mechanical methods such as, for example, the microprecision diamond turning method. Juxtaposing structured glass discs by means of anodic bonding, soldering or bonding is also possible. In the case of plastics, the mirror structure can be produced by mechanical working or as a shaped injection-molded part.

Finally, it is understood that, although the deflecting mirror configurations described herein are laid out for seven individual laser beams, the microoptical device according to the invention can be used for any desired number of individual laser beams. All that is required is to correctly match the number of individual mirrors.

We claim:

1. A microoptical device for reshaping a first laser beam bundle emitted by a laser light source into a second laser beam bundle, the first laser beam bundle extending in an x-direction of an orthogonal reference system and being composed of a plurality of individual laser beams having a strip-shaped cross-section and diverging in a z-direction of the orthogonal reference system, the microoptical device comprising:

beam-parallelizing optics receiving the first laser beam bundle and parallelizing the individual laser beams to mutually parallel strip-shaped laser beams;

a deflecting mirror configuration receiving the mutually parallel strip-shaped laser beams and converting the mutually parallel strip-shaped laser beams into a second laser beam bundle; and said deflecting mirror configuration having a first and a second row of mirrors, said first row of mirrors deflecting the parallelized individual laser beams out of the x-direction and simultaneously offsetting the parallelized individual laser beams relative to one another in the x-direction, such that longitudinal central axes defined within the cross-sections of the parallelized individual laser beams lie on straight lines extending parallel to one another at a given spacing from one another, and said second row of mirrors imaging the mutually offset parallelized individual laser beams parallel and next to one another.

2. The microoptical device according to claim 1, wherein said laser light source is at least one laser diode bar.

3. The microoptical device according to claim 1, wherein said laser light source is a plurality of individual laser diode chips.

4. The microoptical device according to claim 1, wherein the strip-shaped cross-sections of the individual laser beams of the first laser beam bundle each extend along longitudinal central axes lying on a single straight line extending in the y-direction of the orthogonal reference system.

5. The microoptical device according to claim 1, wherein the second laser beam bundle includes a plurality of mutually parallel individual laser beams each having a strip-shaped cross-section.

6. The microoptical device according to claim 5, wherein each of the mutually parallel individual strip-shaped laser beams of the second laser beam bundle have a substantially identical cross section.

7. The microoptical device according to claim 1, wherein each of the mutually parallel strip-shaped laser beams have a substantially identical cross section.

8. The microoptical device according to claim 1, wherein said beam-parallelizing optics include a cylindrical lens.

9. The microoptical device according to claim 8, wherein said beam-parallelizing optics include a diffractive optical system.

10. The microoptical device according to claim 1, wherein said beam-parallelizing optics include a diffractive optical system.

11. A microoptical device for reshaping a first laser beam bundle emitted by a laser light source into a second laser beam bundle, the first laser beam bundle extending in an x-direction of an orthogonal reference system and being composed of a plurality of individual laser beams having a strip-shaped cross-section and diverging in a z-direction of the orthogonal reference system, the microoptical device comprising:

beam-parallelizing optics receiving the first laser beam bundle and parallelizing the individual laser beams to mutually parallel strip-shaped laser beams; and a single row of mirrors each having a mirror surface normal enclosing an angle of 45° with an x-z plane of the orthogonal reference system and an angle $\alpha > 0°$ to an x-y plane of the orthogonal reference system for deflecting the parallelized individual laser beams out of the x-direction, offsetting the parallelized individual laser beams relative to one another in the z-direction, and imaging the parallelized individual laser beams parallel and next to one another for converting the mutually parallel strip-shaped laser beams into a second laser beam bundle.

12. The microoptical device according to claim 1, wherein said beam-parallelizing optics and said deflecting mirror configuration consist of a semiconductor material which is transparent relative to a wavelength of the laser light emitted by said laser light source, and said laser beams being guided in an interior of said semiconductor material.

13. A microoptical device in combination with a laser light source emitting a first laser beam bundle in an x-direction of an orthogonal reference system, the first laser beam bundle being a plurality of individual laser beams having a strip-shaped cross-section and diverging in a z-direction of the orthogonal reference system, the microoptical device, comprising:

beam parallelizing optics receiving the first laser beam bundle and parallelizing the individual laser beams to mutually parallel strip-shaped laser beams; and a deflecting mirror configuration receiving the mutually parallel strip-shaped laser beams and converting the mutually parallel strip-shaped laser beams into a second laser beam bundle; and said deflecting mirror configuration having a first and a second row of mirrors, said first row of mirrors deflecting the parallelized individual laser beams out of the x-direction and simultaneously offsetting the parallelized individual laser beams relative to one another in the x-direction, such that longitudinal central axes defined within the cross-sections of the parallelized individual laser beams lie on straight lines extending parallel to one another at a given spacing from one another, and said second row of mirrors imaging the mutually offset parallelized individual laser beams parallel and next to one another.

14. The microoptical device according to claim 1, wherein the individual laser beams have a given width $\Delta y$, a given height in the z-direction $\Delta z$, and a given distance $\delta$ between each of the individual laser beams, and wherein said first row of said mirrors are formed of a plurality of mirrors each having a mirror surface with a length L and a width W, said length L of said mirror surface defined by one of $L=\Delta y+\delta$ and $L \geq \Delta z/\cos 45°$, and said width of said mirror defined by one of $W=\Delta y+\delta$ and $W \geq \Delta z/\cos 45$.

15. The microoptical device according to claim 11, wherein the individual laser beams have a given width $\Delta y$, and wherein said single row of said mirrors are formed of a plurality of mirrors each having a mirror surface with a length L and said length L of said mirror surface is $L>\Delta y/\cos 45°$.

* * * * *